(12) United States Patent
Cook et al.

(10) Patent No.: US 12,170,319 B2
(45) Date of Patent: Dec. 17, 2024

(54) DUAL CONTACT PROCESS WITH STACKED METAL LAYERS

(71) Applicant: Intel Corporation, Santa Clara, CA (US)

(72) Inventors: Kevin Cook, Portland, OR (US);
Anand S. Murthy, Portland, OR (US);
Gilbert Dewey, Beaverton, OR (US);
Nazila Haratipour, Hillsboro, OR (US); Ralph Thomas Troeger, Portland, OR (US); Christopher J. Jezewski, Portland, OR (US); I-Cheng Tung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 934 days.

(21) Appl. No.: 17/033,362

(22) Filed: Sep. 25, 2020

(65) Prior Publication Data

US 2022/0102510 A1   Mar. 31, 2022

(51) Int. Cl.
| | | |
|---|---|---|
| H01L 29/417 | (2006.01) | |
| H01L 21/8238 | (2006.01) | |
| H01L 27/092 | (2006.01) | |
| H01L 29/40 | (2006.01) | |
| H01L 29/45 | (2006.01) | |
| H01L 29/66 | (2006.01) | |
| H01L 29/78 | (2006.01) | |

(52) U.S. Cl.
CPC .......... *H01L 29/41791* (2013.01); *H01L 21/823814* (2013.01); *H01L 21/823821* (2013.01); *H01L 21/823871* (2013.01); *H01L 27/0924* (2013.01); *H01L 29/401* (2013.01); *H01L 29/45* (2013.01); *H01L 29/66795* (2013.01); *H01L 29/785* (2013.01)

(58) Field of Classification Search
CPC ..... H01L 21/823814; H01L 21/823821; H01L 21/823871; H01L 27/0924; H01L 29/401; H01L 29/41791; H01L 29/45; H01L 29/66795; H01L 29/785
USPC ........................................................ 257/288
See application file for complete search history.

(56) References Cited

U.S. PATENT DOCUMENTS

| | | | |
|---|---|---|---|
| 2020/0091011 A1* | 3/2020 | Khaderbad | ..... H01L 21/823871 |
| 2021/0035868 A1* | 2/2021 | Loh | ....... H01L 29/665 |
| 2021/0193816 A1* | 6/2021 | Chu | ......... H01L 29/45 |
| 2021/0225712 A1* | 7/2021 | Chu | .......... H01L 21/28556 |
| 2023/0361125 A1* | 11/2023 | Khaderbad | ..... H01L 21/823871 |

* cited by examiner

*Primary Examiner* — Matthew E. Gordon
(74) *Attorney, Agent, or Firm* — Schwabe, Williamson & Wyatt P.C.

(57) ABSTRACT

Embodiments disclosed herein include complementary metal-oxide-semiconductor (CMOS) devices and methods of forming CMOS devices. In an embodiment, a CMOS device comprises a first transistor with a first conductivity type, where the first transistor comprises a first source region and a first drain region, and a first metal over the first source region and the first drain region. In an embodiment, the CMOS device further comprises a second transistor with a second conductivity type opposite form the first conductivity type, where the second transistor comprises a second source region and a second drain region, a second metal over the second source region and the second drain region, and the first metal over the second metal.

20 Claims, 18 Drawing Sheets

DUAL CONTACT PROCESS WITH STACKED METAL LAYERS

TECHNICAL FIELD

Embodiments of the present disclosure relate to semiconductor devices, and more particularly to CMOS devices with P-type source/drain contacts with a first metal and N-type source/drain contacts with a stack comprising a second metal and the first metal over the second metal.

BACKGROUND

Resistance in a transistor is undesirable because it reduces drive current and reduces efficiency. As such, high resistance transistors result in degraded performance. The interface between metal and semiconductor is a key source of undesired resistance through a transistor. Selecting the proper metal materials to decrease the resistance is not without issue. Particularly, in a complementary metal-oxide-semiconductor (CMOS) device, there are N-type source/drain regions and P-type source/drain regions. To minimize resistance in both conductivity types, different metals would be required.

Currently, there are several options that may be used to reduce the resistance at the metal-semiconductor interface in CMOS devices. One solution is to use a compromise approach, where the metal chosen yields a good resistance value for one type of source/drain region. However, such embodiments result in the other type of source/drain region resulting in a higher resistance. Another solution is to increase the doping level of the source/drain regions. However, doping cannot be increased endlessly. At high doping concentrations, the dopants begin to form clusters instead of distributing evenly through the semiconductor. High dopant concentrations also may result in diffusion into the channel, which increases off-state current. Yet another solution is to insert a layer of germanium over the P-type source/drain regions. However, germanium is difficult to integrate because it oxidizes and etches very easily. If the germanium can be successfully patterned, the germanium has also been shown to diffuse through titanium during backend processing. This leaves behind voids which result in an increase in the resistance.

EMBODIMENTS OF THE PRESENT DISCLOSURE

Figure 1A:
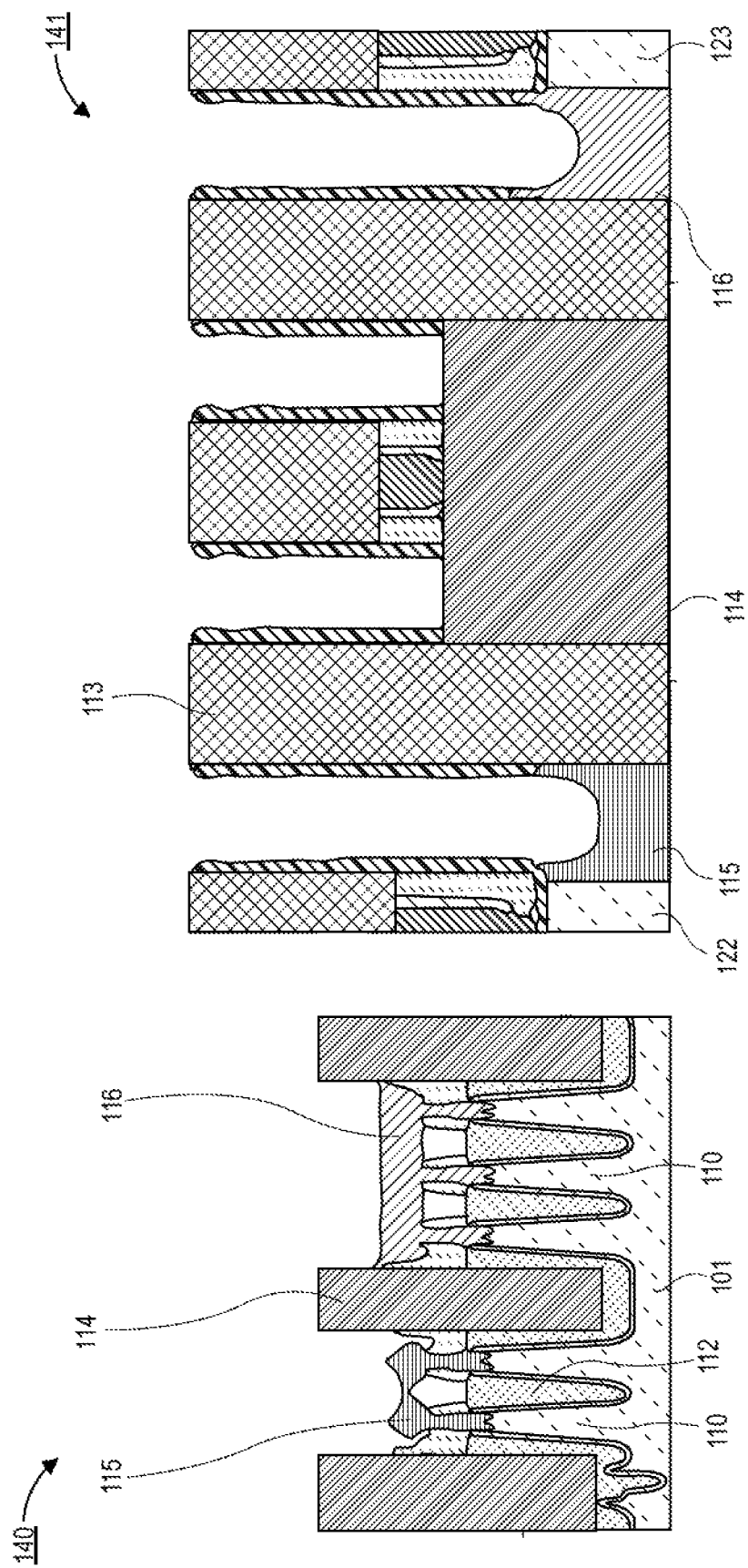
FIG. 1A is a pair of cross-sectional illustrations of the source/drain regions of N-type and P-type transistors in a CMOS device, in accordance with an embodiment.

Described herein are CMOS devices with P-type source/drain contacts with a first metal and N-type source/drain contacts with a stack comprising a second metal and the first metal over the second metal, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the reduction of resistance within transistors allows for improved drive current. A relatively significant source of the resistance in the transistors is at the interface between the epitaxially grown source/drain region (a semiconductor) and the metal contact. The resistance at the semiconductor-metal interface may be minimized through selecting compatible materials that reduce the Schottky barrier at the interface. In complimentary metal-oxide-semiconductor (CMOS) devices, N-type source/drain regions and P-type source/drain regions are included in the device. The metals for minimizing the resistance of the N-type source/drain regions and the P-type source/drain regions are different. Accordingly, in existing solutions, a compromise of the performance of one of the source/drain regions is necessary.

Accordingly, embodiments disclosed herein include a CMOS device that provides a first metal layer interfacing with the N-type source/drain regions and a second metal layer interfacing with the P-type source/drain regions. As will be described in greater detail below, the first metal layer may be in direct contact with the N-type source/drain region, and the second metal layer may be provided over the first metal layer. The second metal layer may be in direct contact with the P-type source/drain region.

As those skilled in the art will appreciate, the processes disclosed herein may be implemented on any non-planar transistor architecture. For example, in FIGS. 1A-1I, a tri-gate transistor architecture with optimized metal-semiconductor interfaces for the P-type and N-type source/drain regions is shown. Additionally, FIGS. 2A-2G illustrate a gate-all-around (GAA) architecture with optimized metal-semiconductor interfaces for the P-type and N-type source/drain regions.

Referring now to FIG. 1A, a pair of cross-sectional illustrations of a CMOS device are shown, in accordance with an embodiment. Cross-section 140 is a fin cut centered on the source/drain regions 115 and 116. That is, the fins 110 extend into and out of the plane of FIG. 1A. Cross-section 141 is a poly cut centered on a fin. As shown, the first source/drain region 115 is adjacent to a channel region 122, and the second source/drain region 116 is adjacent to a channel region 123.

In an embodiment, first source/drain region 115 may be a first conductivity type, and second source/drain region 116 may be a second conductivity type that is opposite from the first conductivity type. For example, the first source/drain region 115 may be P-type, and the second source/drain region may be N-type. In the illustrated embodiment, the first source/drain region 115 couples together a first number of fins 110, and the second source/drain region 116 couples together a second number of fins 110. In an embodiment, the first number of fins 110 may be different than the second number of fins 110, or the first number of fins 110 may be the same as the second number of fins 110. In the particular embodiment illustrated in FIG. 1A, the first number of fins 110 is two, and the second number of fins is three. However, it is to be appreciated that the first number of fins 110 and the second number of fins 110 may comprise any number of fins 110.

In an embodiment, the fins 110 may be high aspect ratio fins that extend up from a substrate 101. The fins 110 and the substrate 101 may be semiconductor material, such as silicon, or any other suitable semiconductor material (e.g., a group III-V semiconductor material). The fins may have a tapered profile in some embodiments. That is, a bottom of the fin 110 may be wider than a top of the fin 110. In an embodiment, the fins 110 may be separated from each other by an isolation layer 112. The isolation layer 112 may extend up from a substrate 101. The top of the isolation layer 112 may be recessed below a top of the fins 110.

In an embodiment, the first source/drain region 115 may be an epitaxially grown semiconductor material that is grown over a top surface of the fins 110. In the case of multiple fins 110, the first source/drain region 115 may merge together in order to electrically couple the fins 110 together. For example, two fins 110 are electrically coupled by the first source/drain region 115. Similarly, three fins 110 are electrically coupled by the second source/drain region 116. In an embodiment, the shapes of the source/drain regions 115 and 116 may be dependent on the conductivity type of the source/drain region 115 or 116. For example, when the first source/drain region 115 is a P-type material, the first source/drain region 115 may have a diamond like shape over each fin 110. When the second source/drain region 116 is an N-type material, the second source/drain region 116 may have a substantially planar top surface.

In an embodiment, the first source/drain region 115 may be separated from the second source/drain region 116 by an isolator 114. The isolator 114 may comprise an insulator filled trench that extends down between the fins 110. In cross-section 141, an isolator 114 is shown between the ends of the first source/drain region 115 and the second source/drain region 116. The isolator 114 may be between isolator features 113.

Figure 1B:
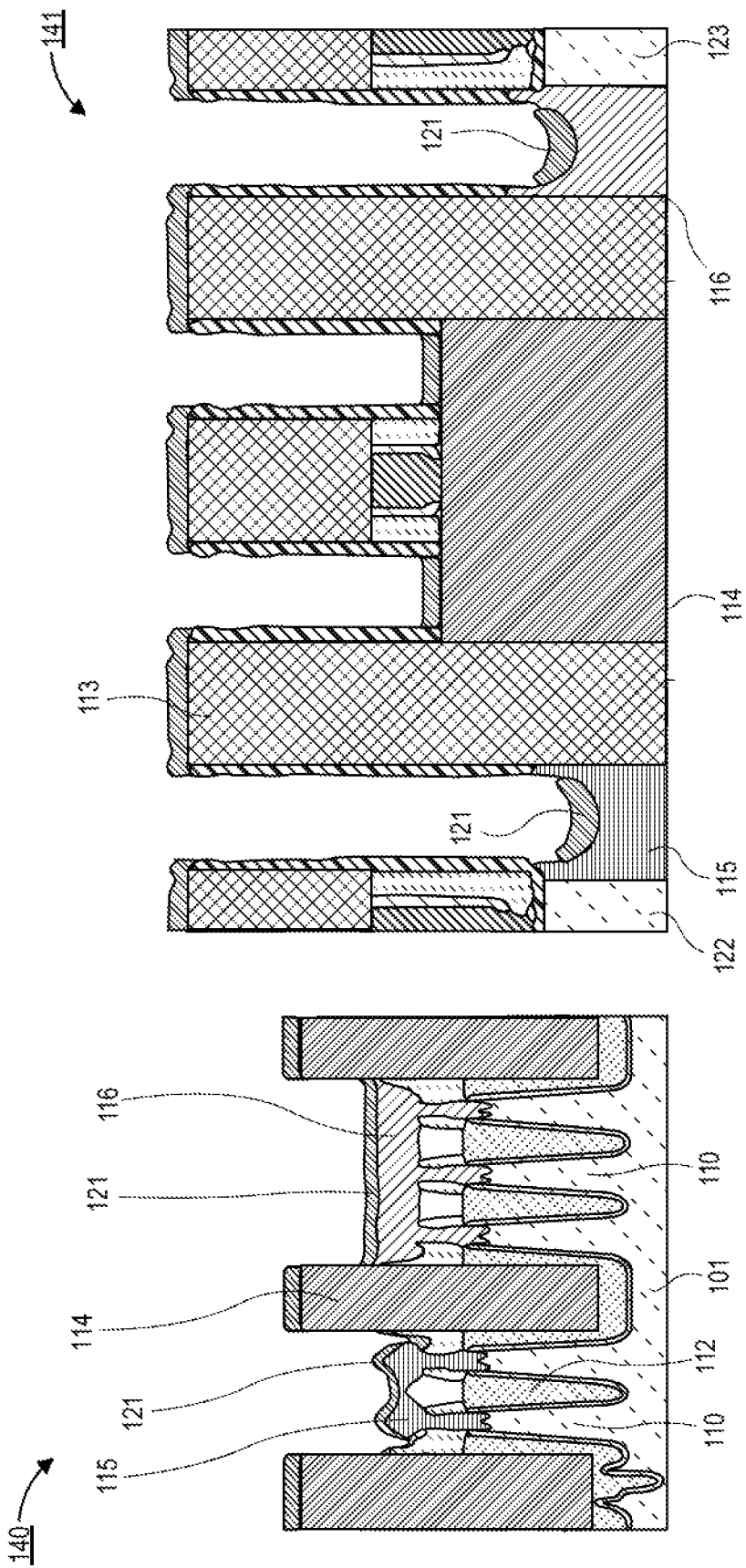
FIG. 1B is a pair of cross-sectional illustrations of the source/drain regions after a first metal layer is disposed over the source/drain regions, in accordance with an embodiment.

Referring now to FIG. 1B, a pair of cross-sectional illustrations 140 and 141 of the CMOS device after a first metal layer 121 is disposed over the exposed surfaces is shown, in accordance with an embodiment. In an embodiment, the first metal layer 121 may be a material that is selected to provide a relatively low resistance interface between the second source/drain region 116 and the first metal layer 121. In an embodiment, where the second source/drain region 116 is an N-type semiconductor, the first metal layer 121 may comprise titanium. However, it is to be appreciated that other metals may also be used such as, but not limited to, nickel, cobalt, molybdenum, or tungsten, depending on the conductivity type, dopant concentration, etc. of the second source/drain region 116.

In an embodiment, the first metal layer 121 may be blanket deposited. That is, the first metal layer 121 is deposited over substantially all of the exposed surfaces. For example, the first metal layer 121 may be deposited over the first source/drain region 115, the second source/drain region 116, the isolators 114, and the isolation features 113. In a particular embodiment, the deposition process is a non-conformal deposition process, such as a physical vapor deposition (PVD) process. A non-conformal deposition process may result in substantially vertical sidewalls not being covered by the first metal layer 121. In an embodiment, the first metal layer 121 may have a thickness that is between approximately 0 nm and approximately 10 nm. In a particular embodiment, the thickness of the first metal layer 121 may be between approximately 3 nm and approximately 7 nm.

Figure 1C:
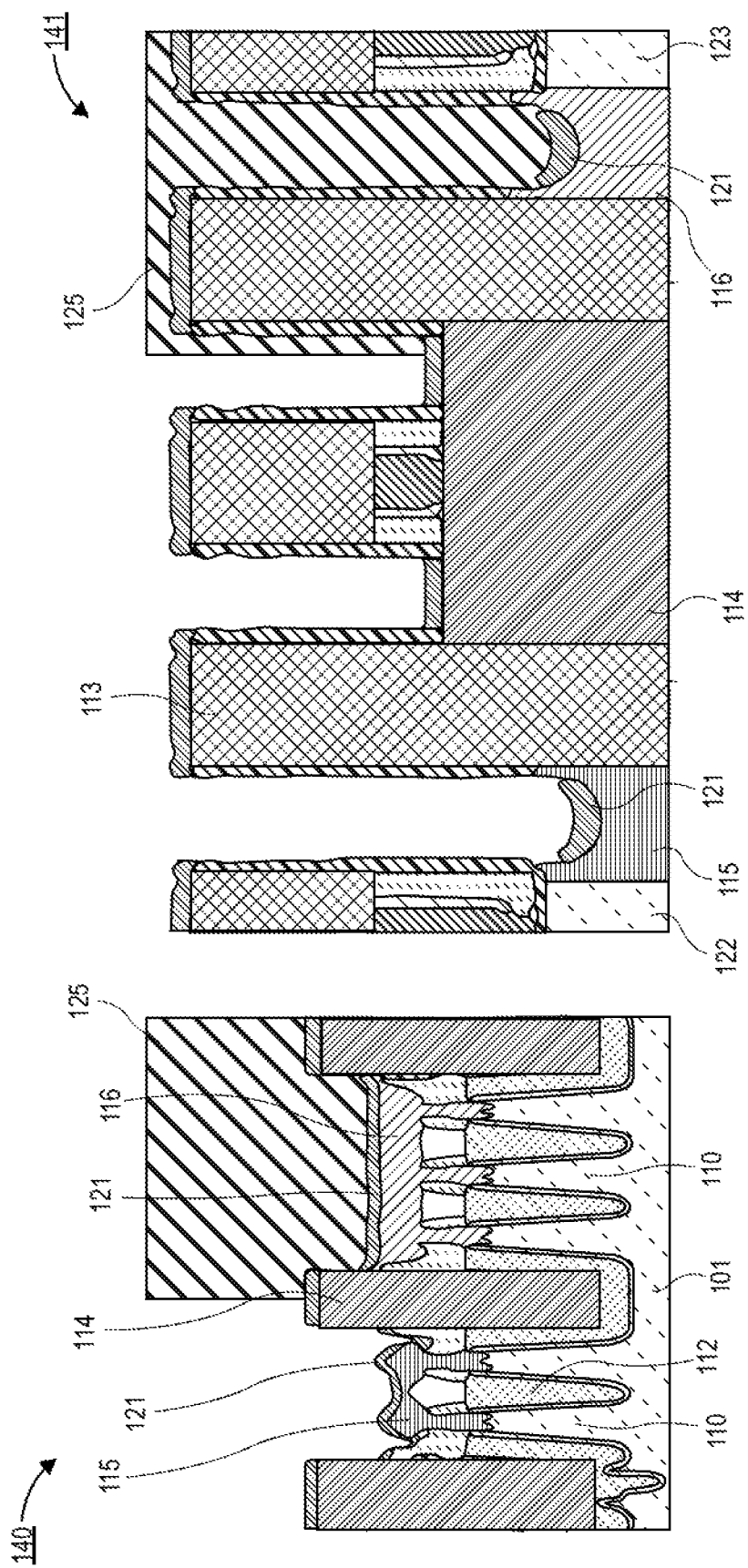
FIG. 1C is a pair of cross-sectional illustrations of the source/drain regions after a mask layer is disposed over the N-type source/drain region, in accordance with an embodiment.

Referring now to FIG. 1C, a pair of cross-sectional illustrations 140 and 141 of the CMOS device after a mask layer 125 is deposited and patterned is shown, in accordance with an embodiment. In an embodiment, the mask layer 125 may be a carbon hardmask, or the like. The mask layer 125 may be patterned with a lithography process. The lithography process may be used to expose the first source/drain region 115. The second source/drain region 116 may be protected by the mask layer 125.

Figure 1D:
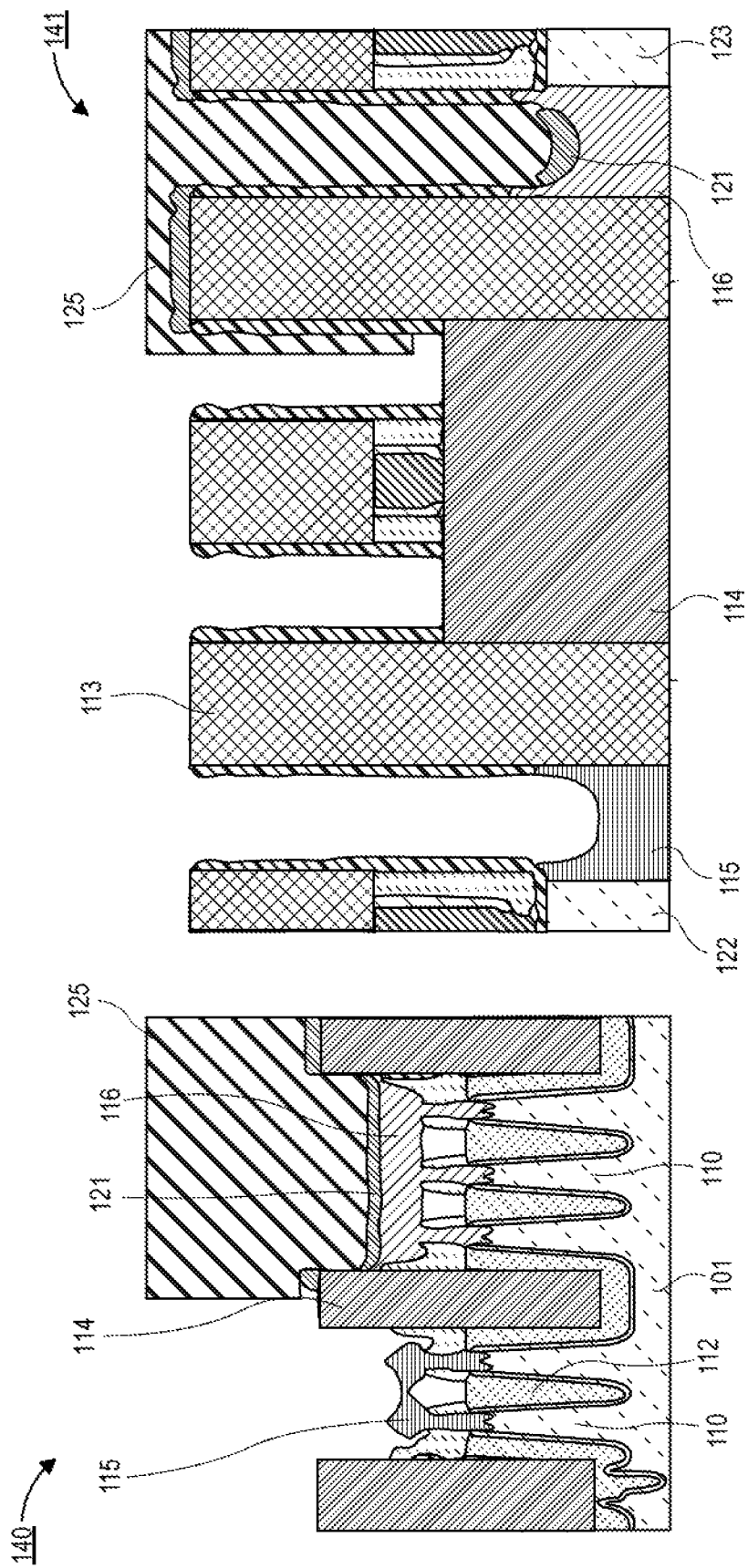
FIG. 1D is a pair of cross-sectional illustrations of the source/drain regions after the first metal layer is removed from over the P-type source/drain region, in accordance with an embodiment.

Referring now to FIG. 1D, a pair of cross-sectional illustrations 140 and 141 of the CMOS device after portions of the first metal layer 121 are removed is shown, in accordance with an embodiment. In an embodiment, the etching process is used to remove the exposed portions of the first metal layer 121 from over the first source/drain region 115. The mask layer 125 protects the portion of the first metal layer 121 over the second source/drain region 116. In an embodiment, the etching process may utilize a wet etching process.

Figure 1E:
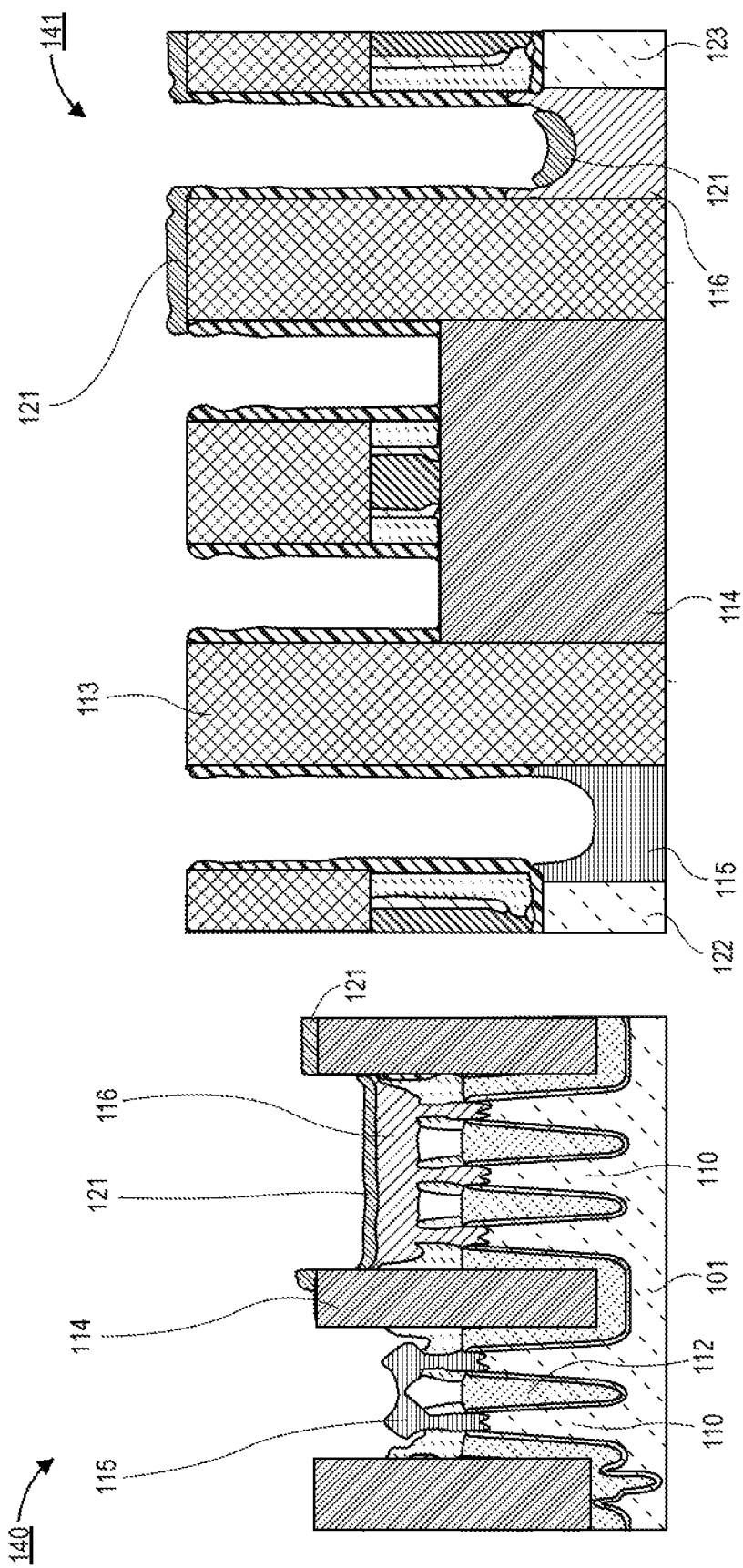
FIG. 1E is a pair of cross-sectional illustrations of the source/drain regions after the mask is removed, in accordance with an embodiment.

Referring now to FIG. 1E, a pair of cross-sectional illustrations 140 and 141 of the CMOS device after the mask layer 125 is removed is shown, in accordance with an embodiment. In an embodiment, the mask layer 125 may be removed with an ashing process, or any other suitable removal process that is selective to the mask layer 125. In an embodiment, after removal of the mask layer 125, the exposed surfaces of the first source/drain region 115 may be cleaned by a wet etching process, or by an in-situ dry etch process.

Figure 1F:
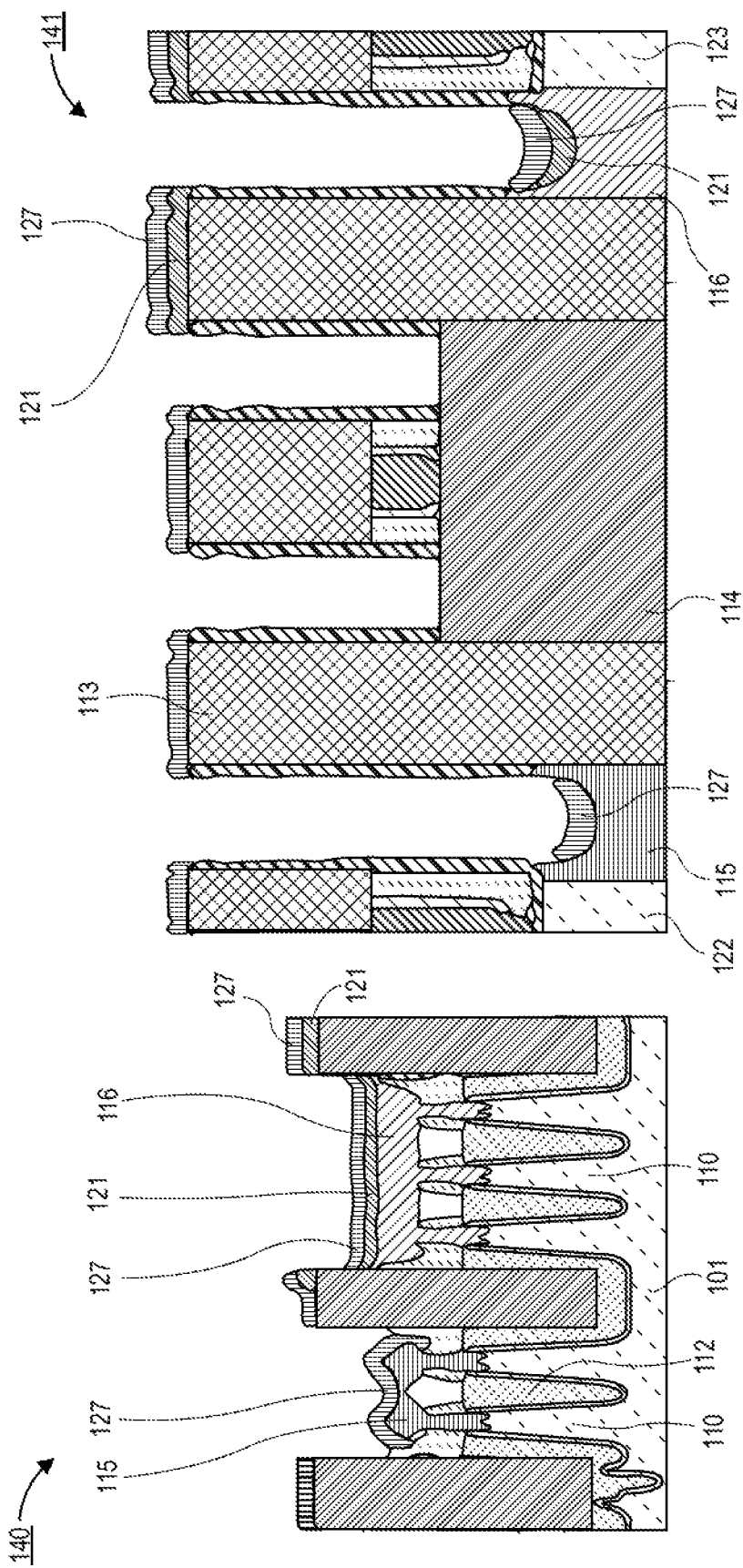
FIG. 1F is a pair of cross-sectional illustrations of the source/drain regions after a second metal layer is disposed over the source/drain regions, in accordance with an embodiment.

Referring now to FIG. 1F, a pair of cross-sectional illustrations 140 and 141 of the CMOS device after a second metal layer 127 is deposited is shown, in accordance with an embodiment. In an embodiment, the second metal layer 127 may be a material chosen to reduce the contact resistance at the interface between the second metal layer 127 and the first source/drain region 115. In an embodiment where the first source/drain region 115 is a P-type semiconductor, the second metal layer 127 may be tungsten. However, it is to be appreciated that other metals may also be used such as, but not limited to, nickel, cobalt, molybdenum, or titanium, depending on the conductivity type, dopant concentration, etc. of the first source/drain region 115.

In an embodiment, the second metal layer 127 may be deposited with a blanket deposition process. That is, substantially all exposed surfaces are covered by the second metal layer 127. In a particular embodiment, a non-conformal deposition process (e.g., PVD) is used to deposit the second metal layer 127. As such, the second metal layer 127 may not deposit along vertical sidewalls. The use of a PVD process also reduces the damage to the semiconductor material of the first source/drain region 115. In an embodiment, the second metal layer 127 may have a thickness that is between approximately 0 nm and approximately 10 nm. In a particular embodiment, the thickness of the second metal layer 127 may be between approximately 3 nm and approximately 7 nm.

It is noted that the second source/drain region 116 includes a stack of the first metal layer 121 and the second metal layer 127. The first metal layer 121 is in direct contact with the second source/drain region 116 and sets the resistance of the interface. The second metal layer 127 that is used to reduce the resistance at the interface of the first source/drain region 115 does not significantly increase the resistance at the interface of the second source/drain region 116. Accordingly, both the first source/drain region 115 and the second source/drain region 116 can be individually optimized to provide a reduced resistance for the CMOS device.

Figure 1G:
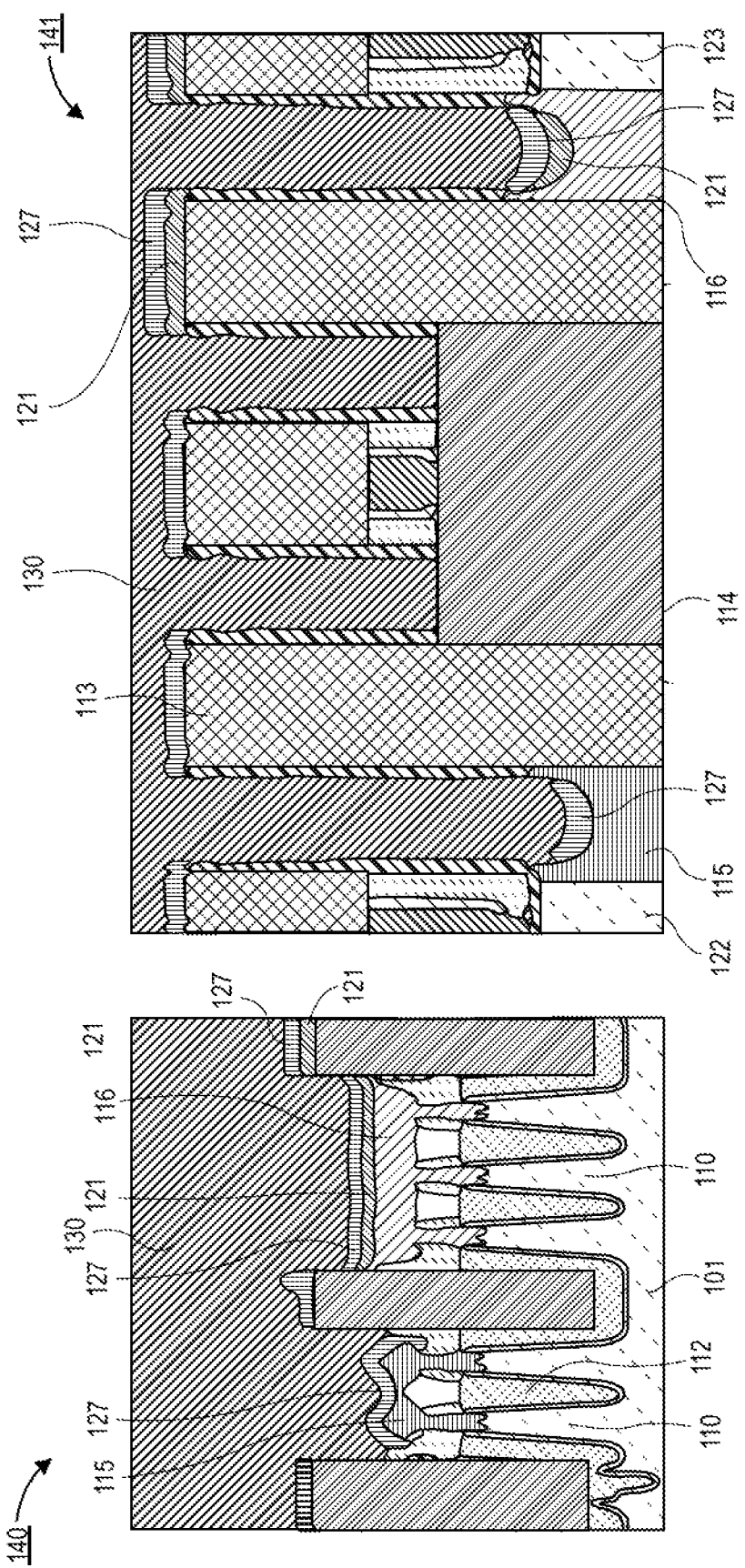
FIG. 1G is a pair of cross-sectional illustrations of the source/drain regions after a contact is disposed over the first metal layer and the second metal layer, in accordance with an embodiment.

Referring now to FIG. 1G, a pair of cross-sectional illustrations 140 and 141 of a CMOS device after a contact fill metal 130 is disposed over the exposed surfaces is shown, in accordance with an embodiment. In an embodiment, the contact fill metal 130 may be deposited with any suitable process, such as a chemical vapor deposition (CVD) process or the like. As shown, in FIG. 1G, the contact fill metal 130 may be the same material as the second metal layer 127. However, it is to be appreciated that in other embodiments, a material for the contact fill metal 130 may be different than the material of the second metal layer 127. Despite being formed with the same material, it may still be possible to discern a difference between the contact fill metal 130 and the second metal layer 127. For example, an analysis (e.g., using transmission electron microscopy (TEM), energy dispersive x-ray (EDX) analysis, atom probe tomography (APT), etc.) of impurities of the contact fill metal 130 and the second metal layer 127 may be used to determine that the two layers were deposited with different processes.

Figure 1H:
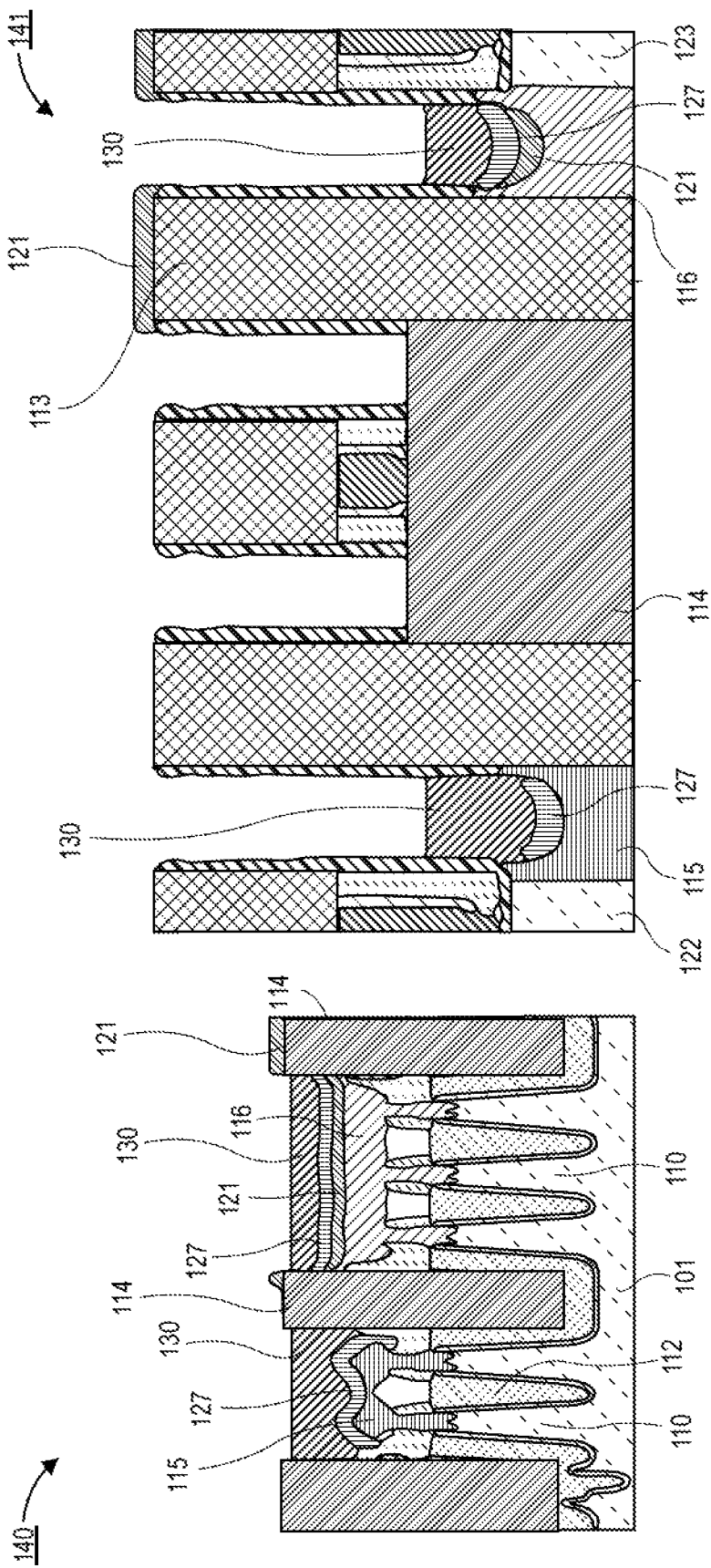
FIG. 1H is a pair of cross-sectional illustrations of the source/drain regions after the contact is recessed, in accordance with an embodiment.
Figure 1I:
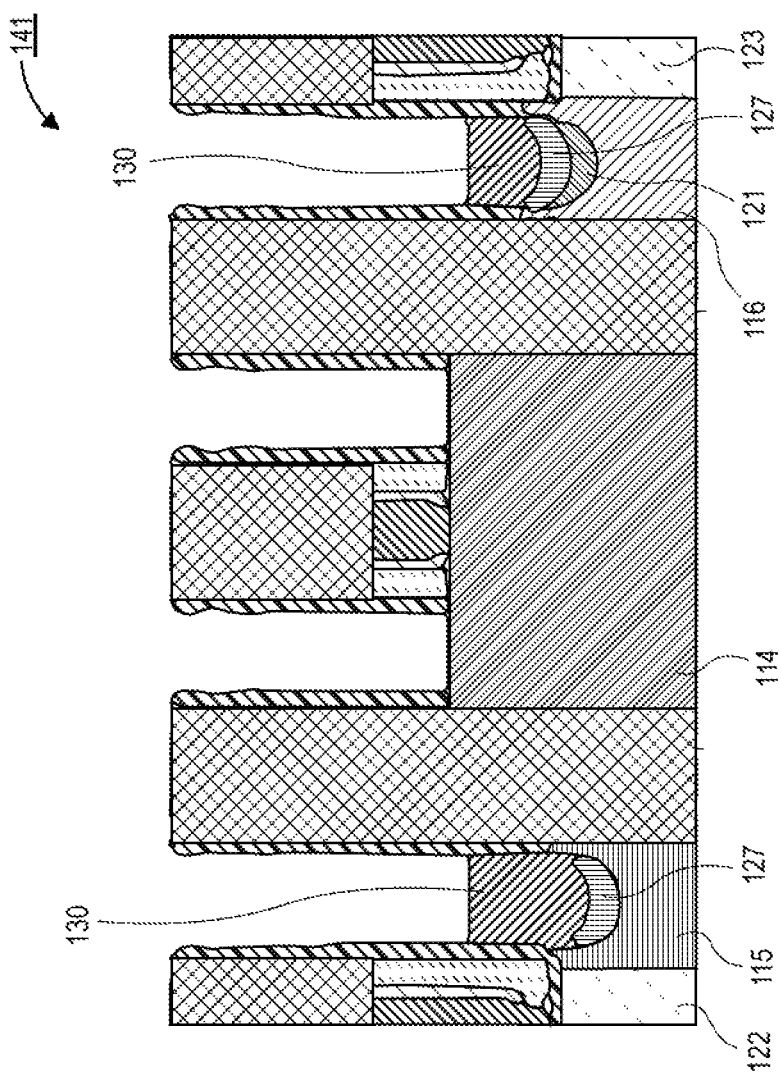
FIG. 1I is a pair of cross-sectional illustrations of the source/drain regions after residual first metal layer is removed, in accordance with an embodiment.
Figure 1I:
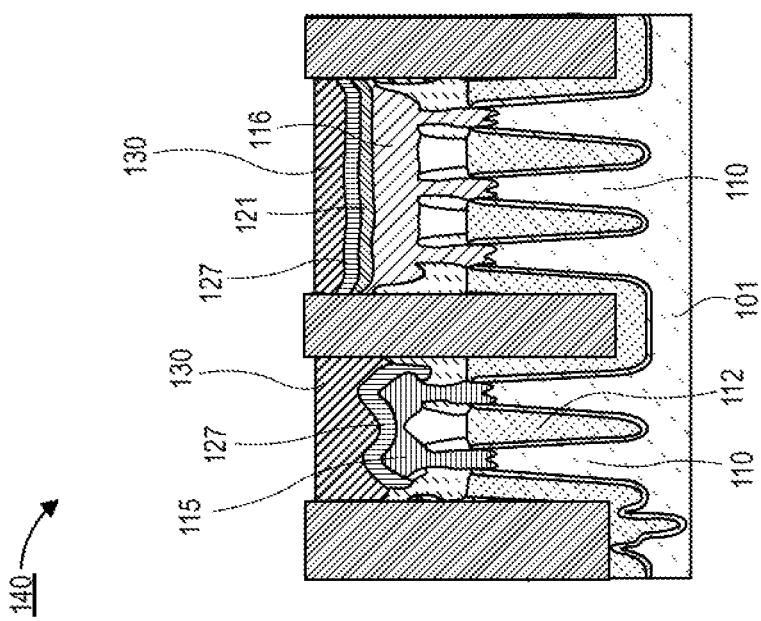

Referring now to FIGS. 1H and 1I, additional illustrations that depict additional processing operations that may be included when the CMOS device is a self-aligned gate electrode (SAGE) type structure is shown, in accordance with an additional embodiment. It is to be appreciated that when a non-SAGE type structure is used, the operations in FIGS. 1H and 1I may be optionally omitted.

Referring now to FIG. 1H, a pair of cross-sections 140 and 141 of the CMOS device after the contact fill metal 130 is recessed is shown, in accordance with an embodiment. In an embodiment, the contact fill metal 130 may be recessed with an etching process or the like. For example, a timed wet etching process may be used to recess the contact fill metal 130. As shown in FIG. 1H, residual portions of the first metal layer 121 may be exposed along top surfaces of the isolators 114 proximate to the second source/drain region 116.

Referring now to FIG. 1I, a pair of cross-sections 140 and 141 of the CMOS device after the residual portions of the first metal layer 121 are removed is shown, in accordance with an embodiment. In an embodiment, the residual portions of the first metal layer 121 may be removed with an etching process, such as a wet etching process.

The structure disclosed in the processing operations described in FIGS. 1A-1I provide a clearly discernable structure that can be identified using various analysis techniques. Particularly, TEM and EDX analysis will show that the second source/drain region 116 includes a stack comprising a first metal layer 121 and a second metal layer 127, and the first source/drain region 115 may only include the second metal layer 127. Additionally, through analysis of impurities (e.g., using APT), it can be shown that the second metal layer 127 over the first source/drain region 115 is deposited at the same time as the second metal layer 127 over the second source/drain region 116. That is, the impurity profiles of the second metal layer 127 will be the same over the first source/drain region 115 and the second source/drain region 116.

Additionally, while shown with the first metal layer 121 being deposited first, followed by the second metal layer 127, embodiments are not limited to such process flows. Instead, the second metal layer 127 may be deposited first, the second metal layer 127 may be removed from the second source/drain region 116, and the first metal layer 121 may be deposited. In such an embodiment, a material stack of the second metal layer 127 and the first metal layer 121 may be provided over the first source/drain region 115, and only the first metal layer 121 may be provided over the second source/drain region 116.

In FIGS. 1A-1I the processing operations are implemented on a tri-gate transistor structure. However, it is to be appreciated that embodiments are not limited to such configurations. For example, gate-all-around (GAA) structures may also benefit from embodiments disclosed herein.

Referring now to FIGS. 2A-2G, sets of cross-sectional illustrations of a CMOS device with a GAA architecture are shown. In FIGS. 2A-2G, a metal contact process is shown that allows for the reduction of the contact resistance by optimizing the material interfaces of both the P-type source/drain region and the N-type source/drain region. In FIGS. 2A-2G, cross-section 250 is a fin cut centered on the source/drain regions 215 and 216, the cross-section 251 is a gate cut centered on the second source/drain region 216, and the cross-section 252 is a gate cut centered on the first source/drain region 215.

Figure 2A:
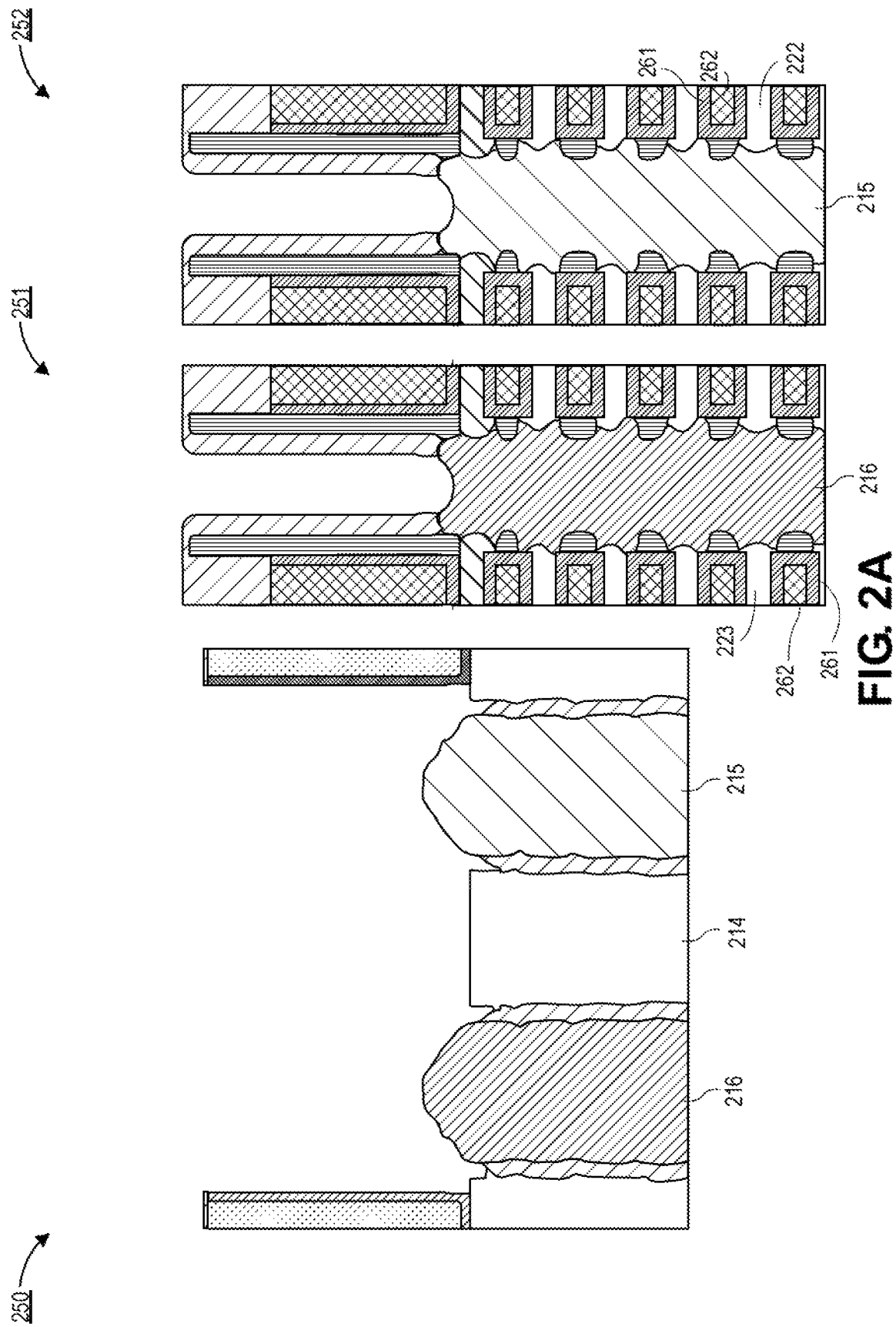
FIG. 2A is a set of cross-sectional illustrations of the source/drain regions of a gate-all-around (GAA) CMOS device, in accordance with an embodiment.

Referring now to FIG. 2A, a set of cross-sectional illustrations 250, 251, and 252 of a GAA CMOS device is shown, in accordance with an embodiment. As shown in cross-section 250, a first source/drain region 215 is separated from a second source/drain region 216 by an isolator 214. As shown, in cross-sections 251 and 252, the source/drain regions 215 and 216 may be coupled to nanowires or nanoribbons 222/223. The nanowires or nanoribbons 222/223 may be surrounded by a gate dielectric 261 and a gate metal 262. The gate metal 262 may comprise a workfunction metal and a gate fill metal in some embodiments.

In an embodiment, the first source/drain region 215 may be a first conductivity type, and the second source/drain region 216 may be a second conductivity type that is opposite from the first conductivity type. For example, the first conductivity type may be P-type, and the second conductivity type may be N-type.

Figure 2B:
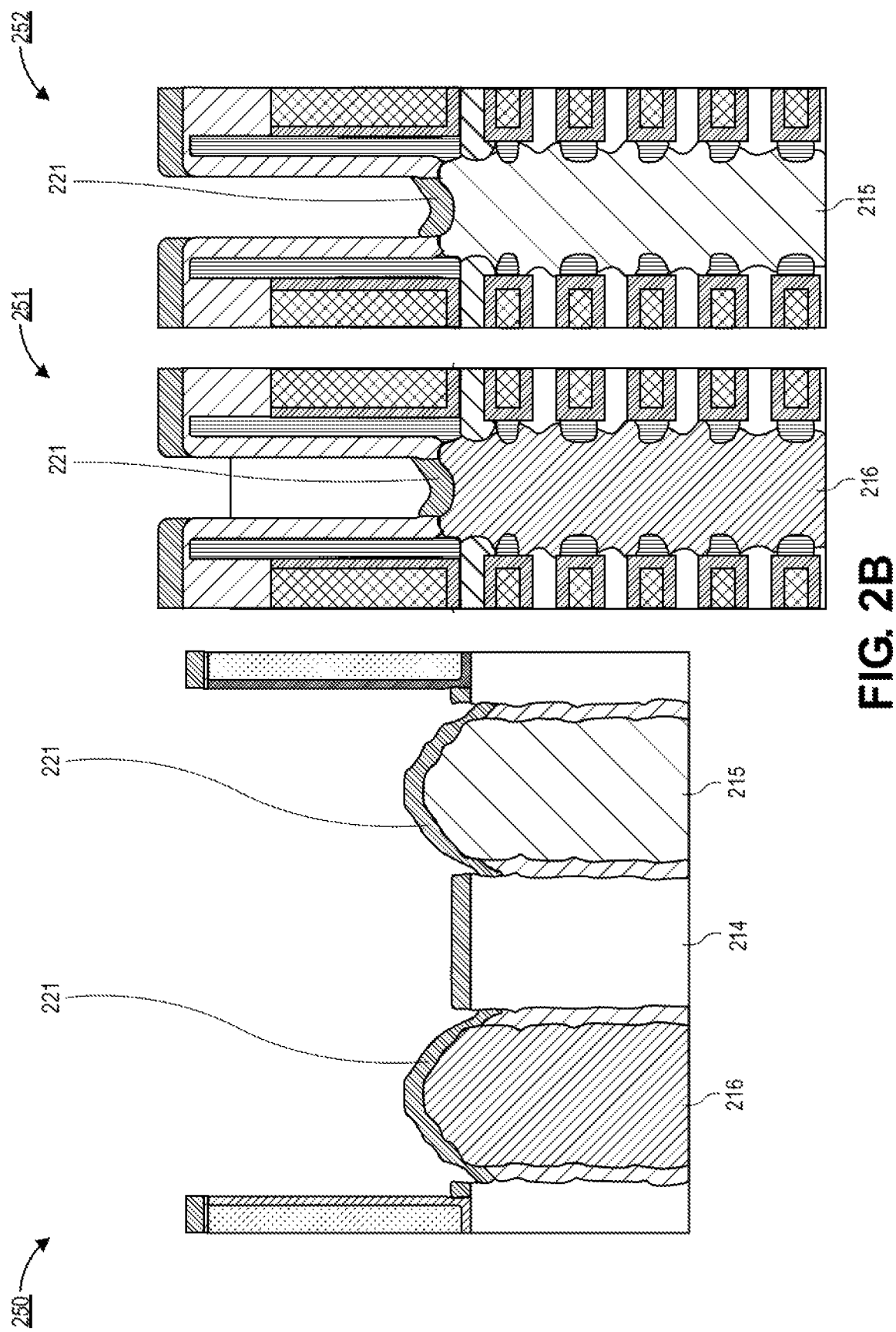
FIG. 2B is a set of cross-sectional illustrations of the source/drain regions after a first metal layer is disposed over the source/drain regions, in accordance with an embodiment.

Referring now to FIG. 2B, a set of cross-sectional illustrations 250, 251, and 252 of the CMOS device after a first metal layer 221 is deposited over the exposed surfaces is shown, in accordance with an embodiment. In an embodiment, the first metal layer 221 may be a may be a material that is selected to provide a relatively low resistance interface between the second source/drain region 216 and the first metal layer 221. In an embodiment, where the second source/drain region 216 is an N-type semiconductor, the first metal layer 221 may comprise titanium. However, it is to be appreciated that other metals may also be used such as, but not limited to, nickel, cobalt, molybdenum, or tungsten, depending on the conductivity type, dopant concentration, etc. of the second source/drain region 216

In an embodiment, the first metal layer 221 may be blanket deposited. That is, the first metal layer 221 is deposited over substantially all of the exposed surfaces. For example, the first metal layer 221 may be deposited over the first source/drain region 215, the isolator 214, and the second source/drain region 216. In a particular embodiment, the deposition process is a non-conformal deposition process, such as a PVD process. A non-conformal deposition process may result in substantially vertical sidewalls not being covered by the first metal layer 221. In an embodiment, the first metal layer 221 may have a thickness that is between approximately 0 nm and approximately 10 nm. In a particular embodiment, the thickness of the first metal layer 221 may be between approximately 3 nm and approximately 7 nm.

Figure 2C:
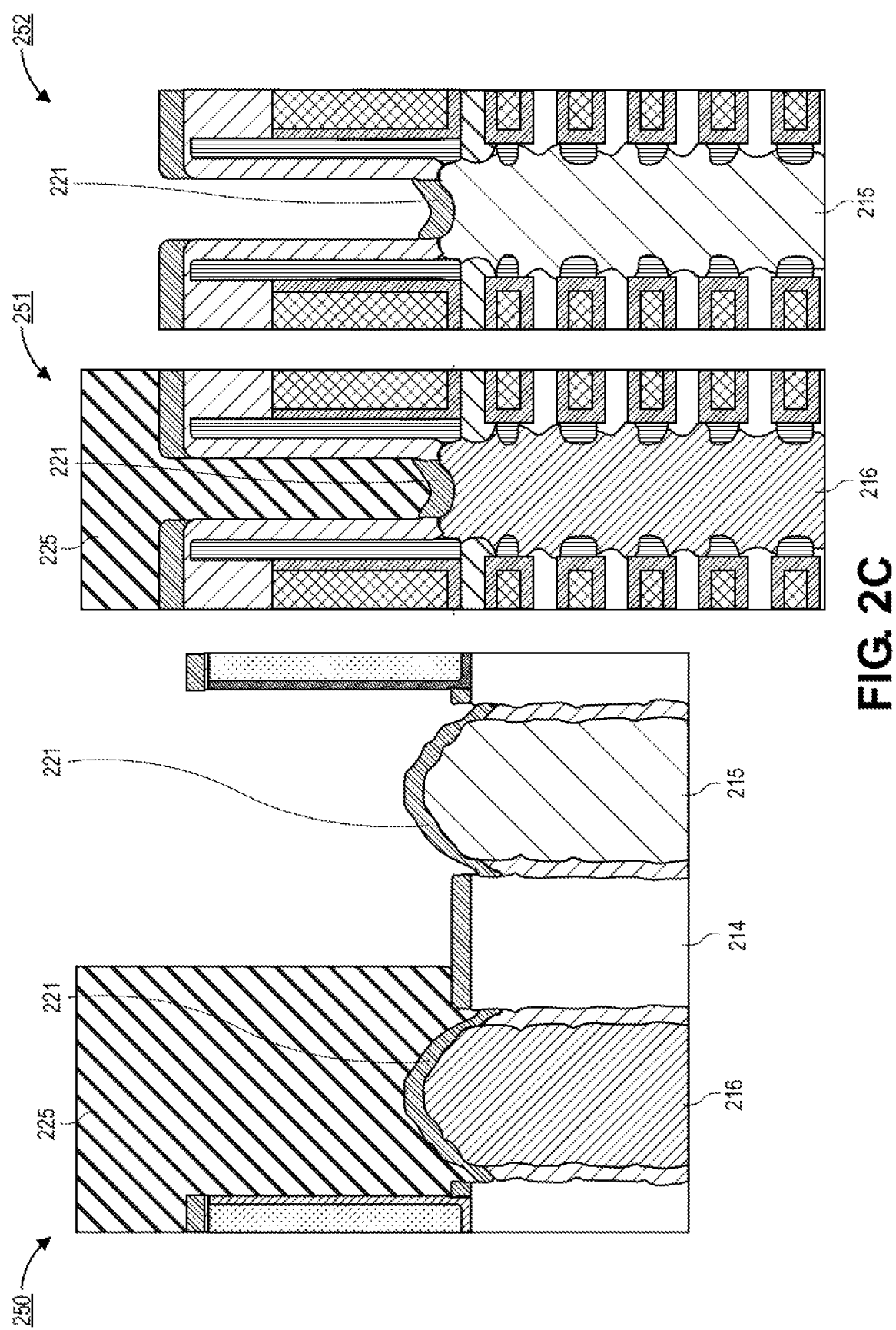
FIG. 2C is a set of cross-sectional illustrations of the source/drain regions after a mask is disposed over the N-type source/drain region, in accordance with an embodiment.

Referring now to FIG. 2C, a set of cross-sectional illustrations 250, 251, and 252 of the CMOS device after a mask layer 225 is deposited and patterned is shown, in accordance with an embodiment. In an embodiment, the mask layer 225 may be a carbon hardmask, or the like. The mask layer 225 may be patterned with a lithography process. The lithography process may be used to expose the first source/drain region 215. The second source/drain region 216 may be protected by the mask layer 225.

Figure 2D:
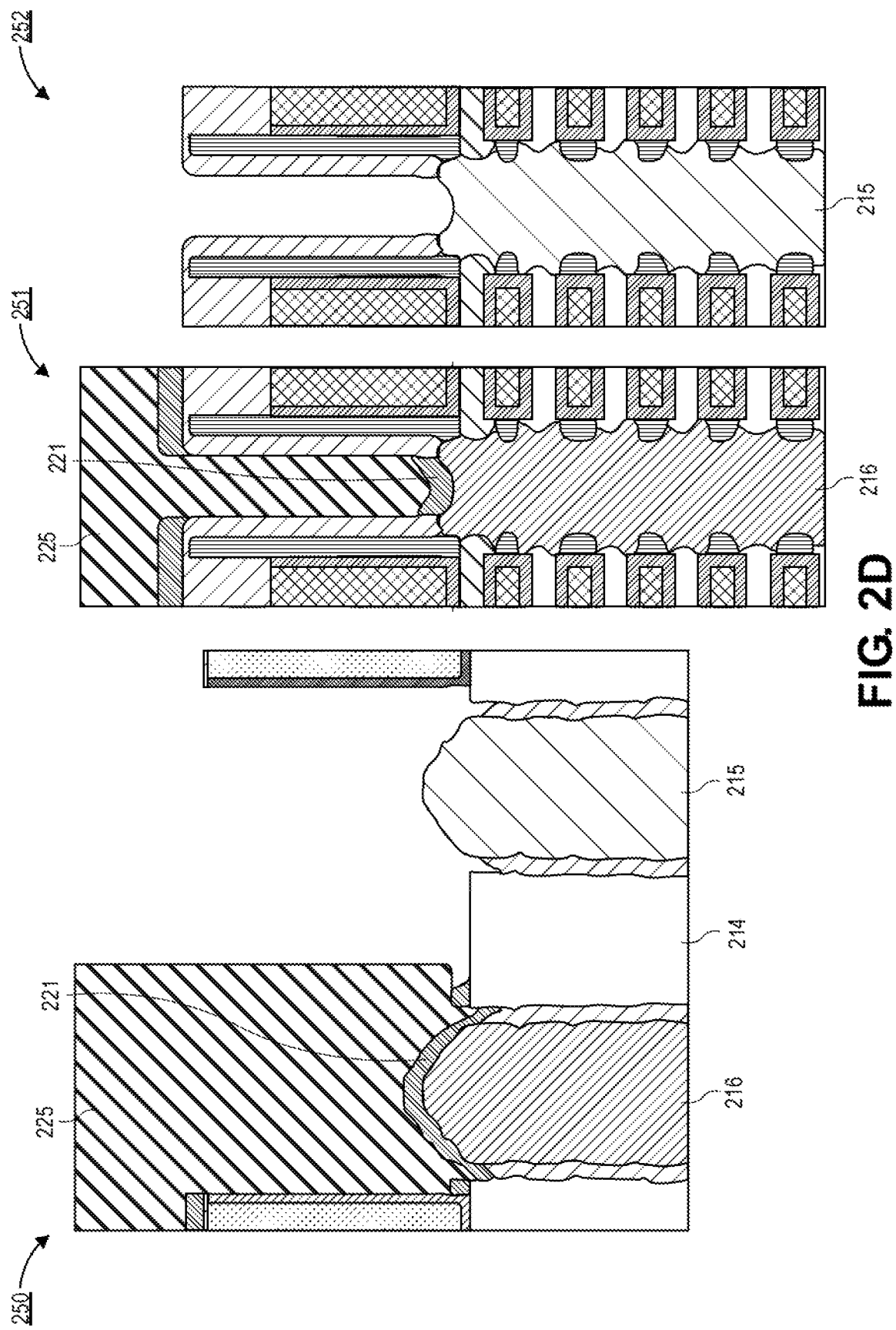
FIG. 2D is a set of cross-sectional illustrations of the source/drain regions after the first metal layer is removed from over the P-type source/drain region, in accordance with an embodiment.

Referring now to FIG. 2D, a set of cross-sectional illustrations 250, 251, and 252 of the CMOS device after portions of the first metal layer 221 are removed is shown, in accordance with an embodiment. In an embodiment, the etching process is used to remove the exposed portions of the first metal layer 221 from over the first source/drain region 215. The mask layer 225 protects the portion of the first metal layer 221 over the second source/drain region 216. In an embodiment, the etching process may utilize a wet etching process.

Figure 2E:
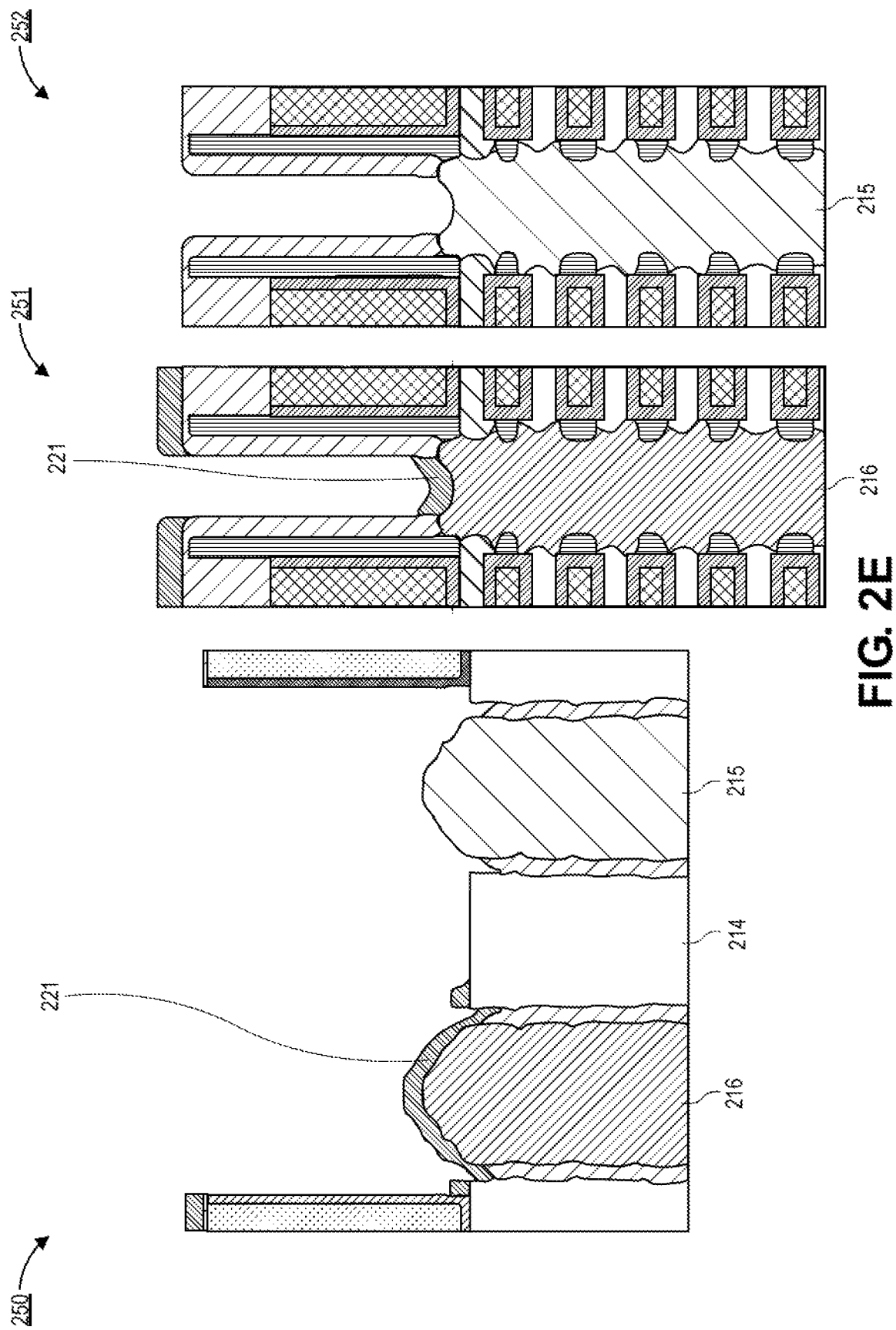
FIG. 2E is a set of cross-sectional illustrations of the source/drain regions after the mask is removed, in accordance with an embodiment.

Referring now to FIG. 2E, a set of cross-sectional illustrations 250, 251, and 252 of the CMOS device after the mask layer 225 is removed is shown, in accordance with an embodiment. In an embodiment, the mask layer 225 may be removed with an ashing process, or any other suitable removal process that is selective to the mask layer 225. In an embodiment, after removal of the mask layer 225, the exposed surfaces of the first source/drain region 215 may be cleaned by a wet etching process, or by an in-situ dry etch process.

Figure 2F:
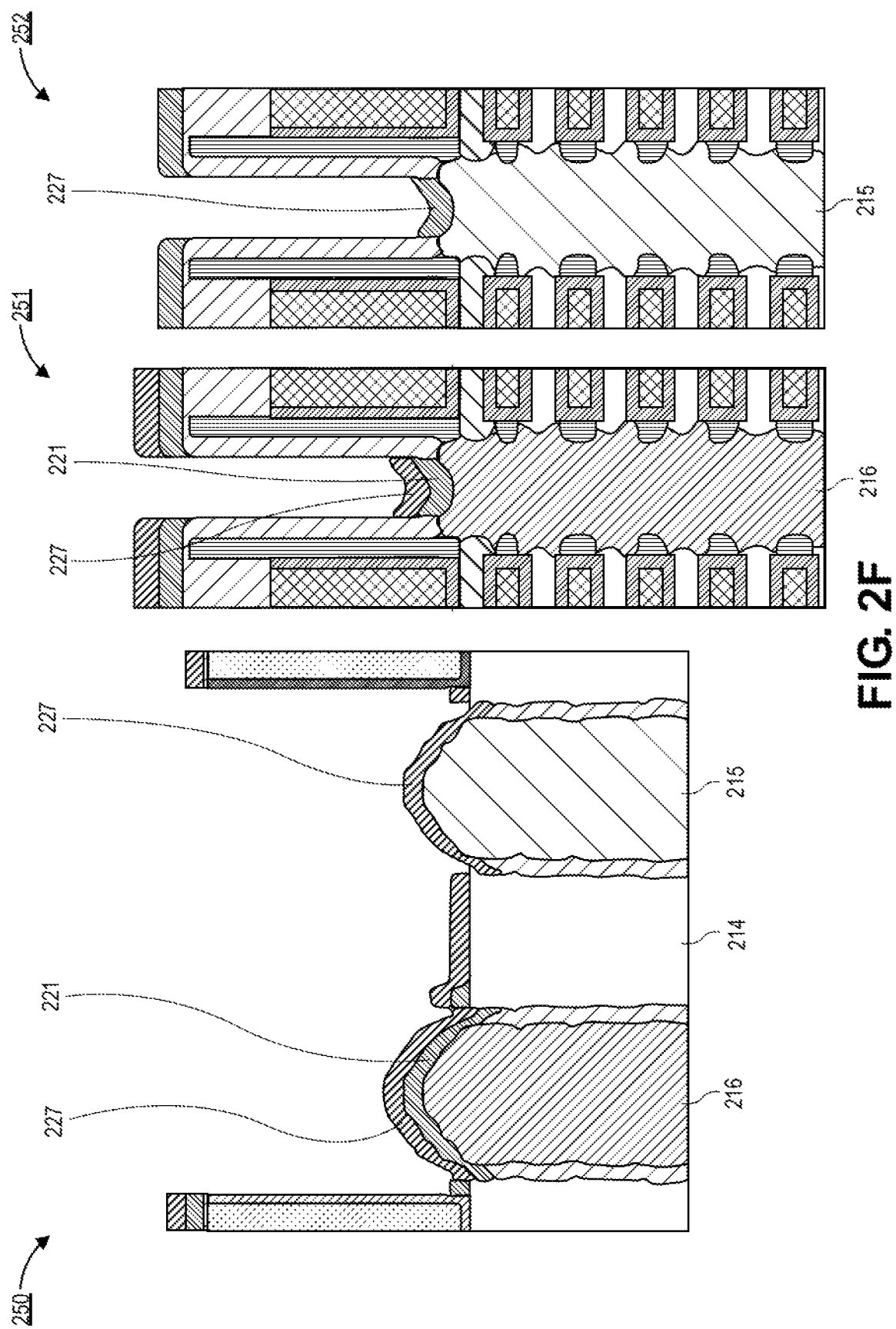
FIG. 2F is a set of cross-sectional illustrations of the source/drain regions after a second metal layer is disposed over the source/drain regions, in accordance with an embodiment.

Referring now to FIG. 2F, a set of cross-sectional illustrations 250, 251, and 252 of the CMOS device after a second metal layer 227 is deposited is shown, in accordance with an embodiment. In an embodiment, the second metal layer 227 may be a material chosen to reduce the contact resistance at the interface between the second metal layer 227 and the first source/drain region 215. In an embodiment where the first source/drain region 215 is a P-type semiconductor, the second metal layer 227 may be tungsten. However, it is to be appreciated that other metals may also be used such as, but not limited to, nickel, cobalt, molybdenum, or titanium, depending on the conductivity type, dopant concentration, etc. of the first source/drain region 215.

In an embodiment, the second metal layer 227 may be deposited with a blanket deposition process. That is, substantially all exposed surfaces are covered by the second metal layer 227. In a particular embodiment, a non-conformal deposition process (e.g., PVD) is used to deposit the second metal layer 227. As such, the second metal layer 227 may not deposit along vertical sidewalls. The use of a PVD process also reduces the damage to the semiconductor material of the first source/drain region 215. In an embodiment, the second metal layer 227 may have a thickness that is between approximately 0 nm and approximately 10 nm. In a particular embodiment, the thickness of the second metal layer 227 may be between approximately 3 nm and approximately 7 nm.

It is noted that the second source/drain region 216 includes a stack of the first metal layer 221 and the second metal layer 227. The first metal layer 221 is in direct contact with the second source/drain region 216 and sets the resistance of the interface. The second metal layer 227 that is used to reduce the resistance at the interface of the first source/drain region 215 does not significantly increase the resistance at the interface of the second source/drain region 216. Accordingly, both the first source/drain region 215 and the second source/drain region 216 can be individually optimized to provide a reduced resistance for the CMOS device.

Figure 2G:
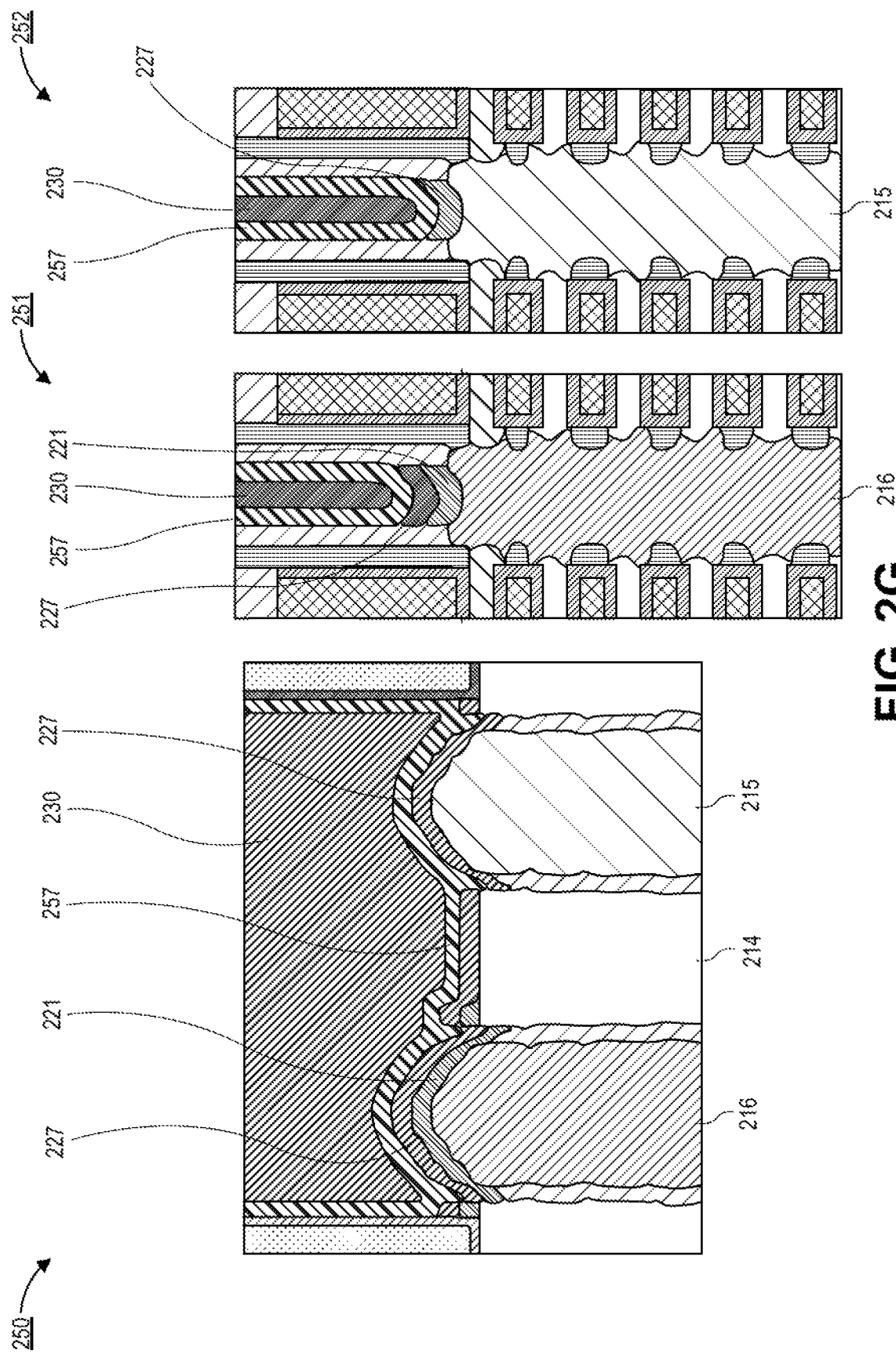
FIG. 2G is a set of cross-sectional illustrations after a contact is disposed over the source/drain regions, in accordance with an embodiment.

Referring now to FIG. 2G, a set of cross-sectional illustrations 250, 251, and 252 of a CMOS device after a contact fill metal 230 is disposed over the exposed surfaces is shown, in accordance with an embodiment. In an embodiment, the contact fill metal 230 may be deposited with any suitable process, such as a chemical vapor deposition (CVD) process or the like. In an embodiment, a liner 257 may be provided before the contact fill metal 230 is deposited. The liner 257 may be a conformal liner that functions as a barrier layer to protect underlying semiconductor materials from the chemical precursors used to form the contact fill metal 230.

However, the liner 257 may be omitted in some embodiments. As shown, in FIG. 2G, the contact fill metal 230 may be the same material as the second metal layer 227. However, it is to be appreciated that in other embodiments, a material for the contact fill metal 230 may be different than the material of the second metal layer 227. Despite being formed with the same material, it may still be possible to discern a difference between the contact fill metal 230 and the second metal layer 227. For example, an analysis (e.g., using transmission electron microscopy (TEM), energy dispersive x-ray (EDX) analysis, atom probe tomography (APT), etc.) of impurities of the contact fill metal 230 and the second metal layer 227 may be used to determine that the two layers were deposited with different processes.

The structure disclosed in the processing operations described in FIGS. 2A-2G provide a clearly discernable structure that can be identified using various analysis techniques. Particularly, TEM and EDX analysis will show that the second source/drain region 216 includes a stack comprising a first metal layer 221 and a second metal layer 227, and the first source/drain region 215 may only include the second metal layer 227. Additionally, through analysis of impurities (e.g., using APT), it can be shown that the second metal layer 227 over the first source/drain region 215 is deposited at the same time as the second metal layer 227 over the second source/drain region 216. That is, the impurity profiles of the second metal layer 227 will be the same over the first source/drain region 215 and the second source/drain region 216.

Additionally, while shown with the first metal layer 221 being deposited first, followed by the second metal layer 227, embodiments are not limited to such process flows. Instead, the second metal layer 227 may be deposited first, the second metal layer 227 may be removed from the second source/drain region 216, and the first metal layer 221 may be deposited. In such an embodiment, a material stack of the second metal layer 227 and the first metal layer 221 may be provided over the first source/drain region 215, and only the first metal layer 221 may be provided over the second source/drain region 216.

Figure 3:
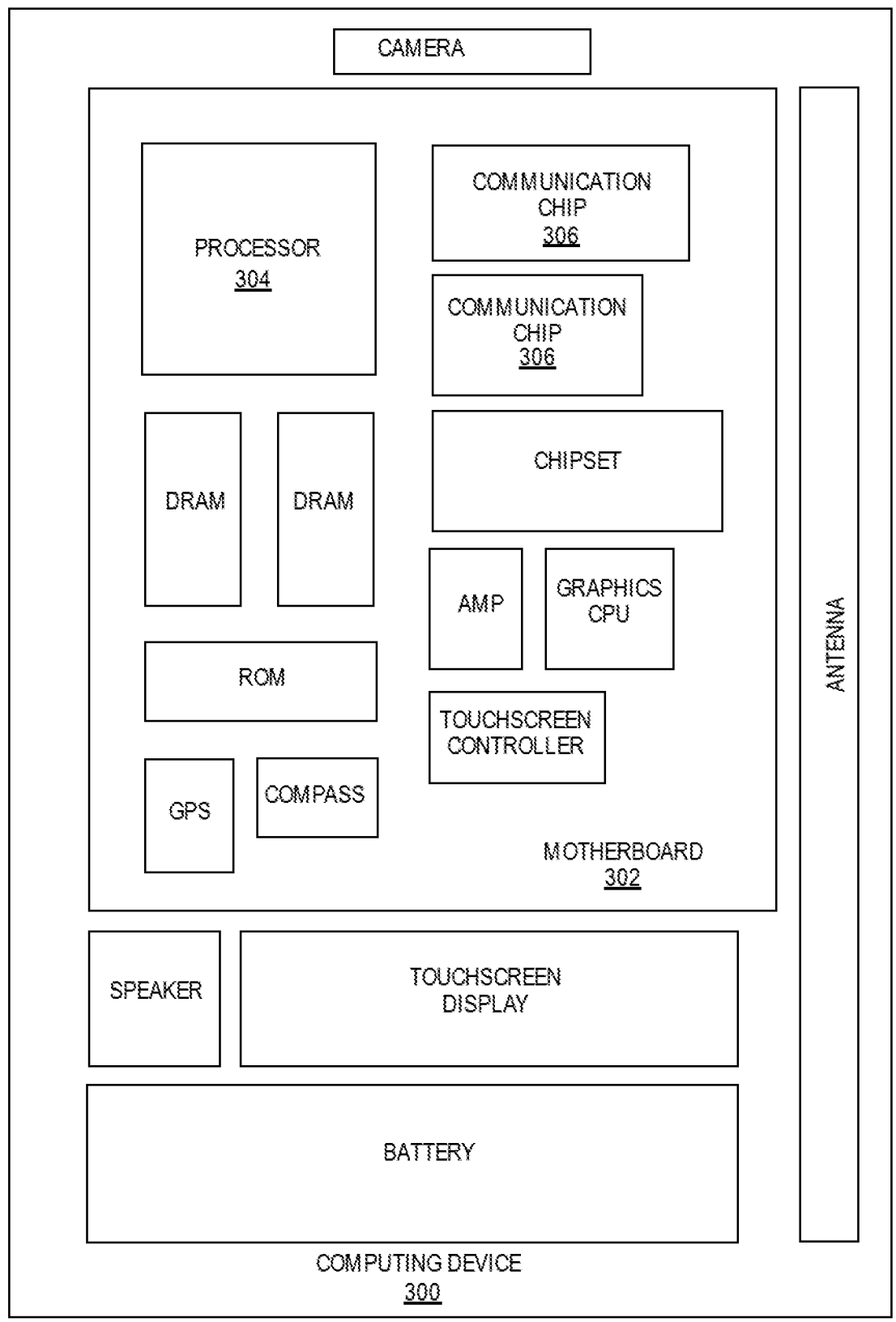
FIG. 3 illustrates a computing device in accordance with one implementation of an embodiment of the disclosure.

FIG. 3 illustrates a computing device 300 in accordance with one implementation of an embodiment of the disclosure. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In an embodiment, the integrated circuit die of the processor may comprise a CMOS device with optimized contact interfaces, where a first source/drain region is covered by a first metal layer and a second metal layer, and a second source/drain region is covered by the second metal layer, such as those described herein. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In an embodiment, the integrated circuit die of the communication chip may comprise a CMOS device with optimized contact interfaces, where a first source/drain region is covered by a first metal layer and a second metal layer, and a second source/drain region is covered by the second metal layer, such as those described herein.

In further implementations, another component housed within the computing device 300 may comprise a CMOS device with optimized contact interfaces, where a first source/drain region is covered by a first metal layer and a second metal layer, and a second source/drain region is covered by the second metal layer, such as those described herein.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
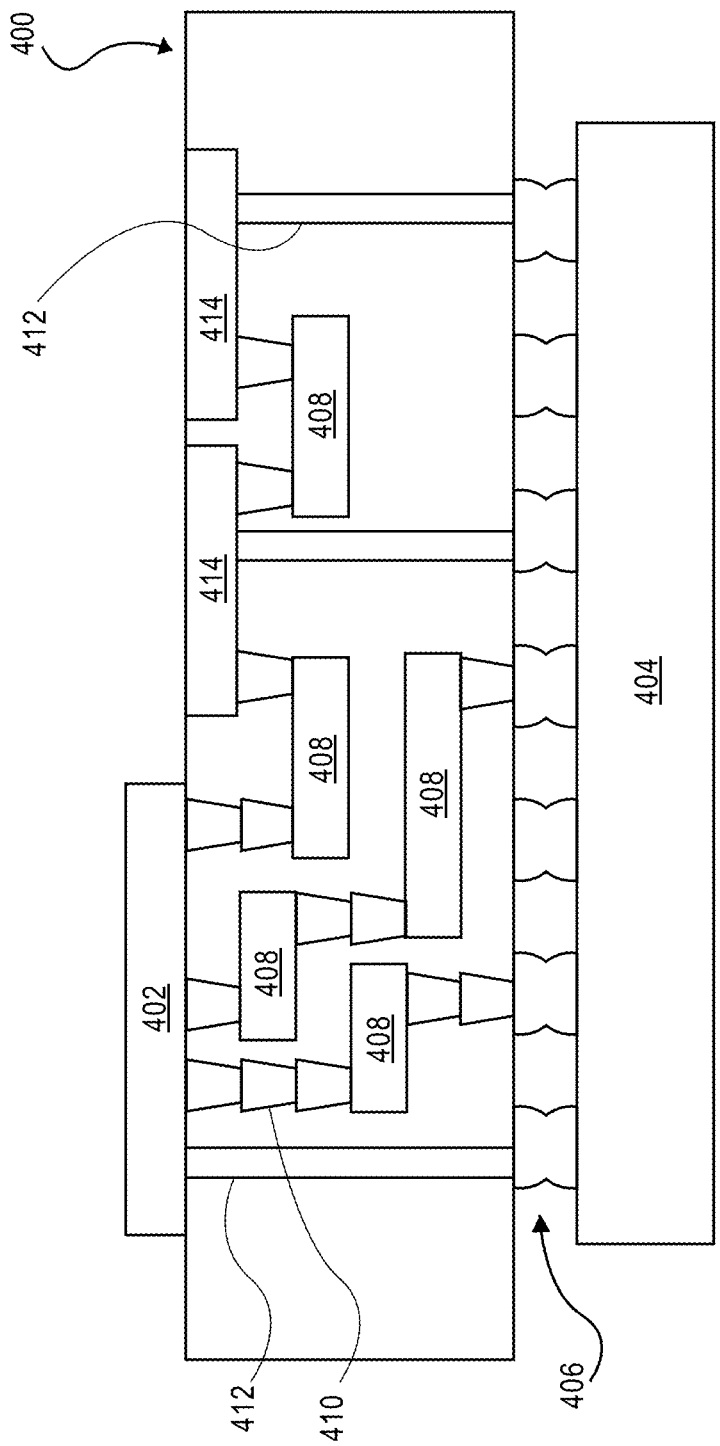
FIG. 4 is an interposer implementing one or more embodiments of the disclosure.

FIG. 4 illustrates an interposer 400 that includes one or more embodiments of the disclosure. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. In an embodiment, one of both of the first substrate 402 and the second substrate 404 may comprise a CMOS device with optimized contact interfaces, where a first source/drain region is covered by a first metal layer and a second metal layer, and a second source/drain region is covered by the second metal layer, in accordance with embodiments described herein. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer 400 may be formed of alternate rigid or flexible materials that may include the same materials described above for use in a semiconductor substrate, such as silicon, germanium, and other group III-V and group IV materials The interposer 400 may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the disclosure, apparatuses or processes disclosed herein may be used in the fabrication of interposer 400.

Thus, embodiments of the present disclosure may comprise a CMOS device with optimized contact interfaces, where a first source/drain region is covered by a first metal layer and a second metal layer, and a second source/drain region is covered by the second metal layer, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a complementary metal-oxide-semiconductor (CMOS) device, comprising: a first transistor with a first conductivity type, wherein the first transistor comprises: a first source region and a first drain region; and a first metal over the first source region and the first drain region; and a second transistor with a second conductivity type opposite form the first conductivity type, wherein the second transistor comprises: a second source region and a second drain region; a second metal over the second source region and the second drain region; and the first metal over the second metal.

Example 2: the CMOS device of Example 1, wherein the first metal comprises tungsten, and wherein the second metal comprises one or more of titanium, nickel, cobalt, and molybdenum.

Example 3: the CMOS device of Example 1 or Example 2, wherein a thickness of the first metal is between approximately 1 nm and approximately 10 nm.

Example 4: the CMOS device of Examples 1-3, wherein the first conductivity type is P-type, and wherein the second conductivity type is N-type.

Example 5: the CMOS device of Examples 1-3, wherein the first conductivity type is N-type, and wherein the second conductivity type is P-type.

Example 6: the CMOS device of Examples 1-5, wherein the first transistor and the second transistor are non-planar devices.

Example 7: the CMOS device of Example 6, wherein the non-planar devices are tri-gate devices.

Example 8: the CMOS device of Example 6, wherein the non-planar devices are gate-all-around (GAA) devices.

Example 9: the CMOS device of Examples 1-8, wherein the first transistor comprises a first number of fins, and wherein the second transistor comprises a second number of fins.

Example 10: CMOS device of Example 9, wherein the second number of fins is greater than the first number of fins.

Example 11: the CMOS device of Examples 1-10, wherein the first source region and the first drain region comprise a diamond shaped region.

Example 12: a complementary metal-oxide-semiconductor (CMOS), comprising: a first non-planar transistor of a first conductivity type, wherein the first non-planar transistor comprises: a first fin extending up from a substrate; a second fin extending up from the substrate; a first source region connecting the first fin to the second fin; a first drain region connecting the first fin to the second fin; a first metal over the first source region and the first drain region; and first contacts connected to the first metal over the first source region and the first drain region; and a second non-planar transistor of a second conductivity type that is opposite from the first conductivity type, wherein the second non-planar transistor comprises: a third fin extending up from the substrate; a fourth fin extending up from the substrate; a fifth fin extending up from the substrate; a second source region connecting the third fin, the fourth fin, and the fifth fin together; a second drain region connecting the third fin, the fourth fin, and the fifth fin together; a second metal over the second source region and the second drain region; the first metal over the second metal; and second contacts connected to the first metal over the second source region and the second drain region.

Example 13: the CMOS device of Example 12, wherein the first conductivity type is P-type, and wherein the second conductivity type is N-type.

Example 14: the CMOS device of Example 12 or Example 13, wherein the first metal comprises the same constituents as the first contacts and the second contacts.

Example 15: the CMOS device of Example 14, wherein first impurities in the first metal are different than second impurities in the first contacts and the second contacts.

Example 16: the CMOS device of Examples 12-15, wherein the first metal comprises tungsten, and wherein the second metal comprises one or more of titanium, nickel, cobalt, and molybdenum.

Example 17: the CMOS device of Examples 12-16, wherein a thickness of the first metal is between approximately 1 nm and approximately 10 nm.

Example 18: the CMOS device of Examples 12-17, wherein first impurities in the first metal on the first non-planar transistor are the same as second impurities in the first metal on the second non-planar transistor.

Example 19: a method of forming a complementary metal-oxide-semiconductor (CMOS) device, comprising: providing a first non-planar transistor of a first conductivity type and a second non-planar transistor of a second conductivity type that is opposite from the first conductivity type, wherein the first non-planar transistor comprises a first source region and a first drain region, and wherein the second non-planar transistor comprises a second source region and a second drain region; depositing a first metal over the first source region, the first drain region, the second source region, and the second drain region; forming a mask over the second source region and the second drain region, wherein the first source region and the first drain region are exposed; removing the first metal from over the first source region and the first drain region; removing the mask; and depositing a second metal, wherein the second metal directly contacts the first source region and the first drain region, and wherein the second metal directly contacts the first metal over the second source region and the second drain region.

Example 20: the method of Example 19, wherein the second metal is deposited with a physical vapor deposition process.

Example 21: the method of Example 20, further comprising: depositing a contact over the second metal, wherein the contact comprises the same material as the second metal.

Example 22: the method of Example 21, wherein the contact is deposited with a chemical vapor deposition process.

Example 23: the method of Examples 19-22, wherein the first metal comprises one or more of titanium, nickel, cobalt, and molybdenum, and wherein the second metal comprises tungsten.

Example 24: an electronic device, comprising: a board; a package substrate attached to the board; and a die electrically coupled to the package substrate, wherein the die comprises a complimentary metal-oxide-semiconductor (CMOS) device, wherein the CMOS device comprises: a first transistor with a first metal between a first source region and a first contact; and a second transistor with a second metal and the first metal between a second source region and a second contact.

Example 25: the electronic device of Example 24, wherein the first transistor is a P-type transistor, and wherein the second transistor is an N-type transistor.

What is claimed is:

1. A complementary metal-oxide-semiconductor (CMOS) device, comprising:
a first transistor with a first conductivity type, wherein the first transistor comprises:
a first source region and a first drain region; and
a first metal over and in contact with the first source region and the first drain region; and
a second transistor with a second conductivity type opposite from the first conductivity type, wherein the second transistor comprises:
a second source region and a second drain region;
a second metal over and in contact with the second source region and the second drain region; and
the first metal over and in contact with the second metal, the first metal different than the second metal, and the first metal in contact with the second source region and the second drain region.

2. The CMOS device of claim 1, wherein the first metal comprises tungsten, and wherein the second metal comprises one or more of titanium, nickel, cobalt, and molybdenum.

3. The CMOS device of claim 1, wherein a thickness of the first metal is between approximately 1 nm and approximately 10 nm.

4. The CMOS device of claim 1, wherein the first conductivity type is P-type, and wherein the second conductivity type is N-type.

5. The CMOS device of claim 1, wherein the first conductivity type is N-type, and wherein the second conductivity type is P-type.

6. The CMOS device of claim 1, wherein the first transistor and the second transistor are non-planar devices.

7. The CMOS device of claim 6, wherein the non-planar devices are tri-gate devices.

8. The CMOS device of claim 6, wherein the non-planar devices are gate-all-around (GAA) devices.

9. The CMOS device of claim 1, wherein the first transistor comprises a first number of fins, and wherein the second transistor comprises a second number of fins.

10. The CMOS device of claim 9, wherein the second number of fins is greater than the first number of fins.

11. The CMOS device of claim 1, wherein the first source region and the first drain region comprise a diamond shaped region.

12. A complementary metal-oxide-semiconductor (CMOS), comprising:
a first non-planar transistor of a first conductivity type, wherein the first non-planar transistor comprises:
a first fin extending up from a substrate;
a second fin extending up from the substrate;
a first source region connecting the first fin to the second fin;
a first drain region connecting the first fin to the second fin;
a first metal over and in contact with the first source region and the first drain region; and
first contacts connected to the first metal over the first source region and the first drain region; and
a second non-planar transistor of a second conductivity type that is opposite from the first conductivity type, wherein the second non-planar transistor comprises:
a third fin extending up from the substrate;
a fourth fin extending up from the substrate;
a fifth fin extending up from the substrate;
a second source region connecting the third fin, the fourth fin, and the fifth fin together;
a second drain region connecting the third fin, the fourth fin, and the fifth fin together;
a second metal over and in contact with the second source region and the second drain region;
the first metal over and in contact with the second metal; and
second contacts connected to the first metal over the second source region and the second drain region, the first metal different than the second metal, and the first metal in contact with the second source region and the second drain region.

13. The CMOS device of claim 12, wherein the first conductivity type is P-type, and wherein the second conductivity type is N-type.

14. The CMOS device of claim 12, wherein the first metal comprises the same constituents as the first contacts and the second contacts.

15. The CMOS device of claim 14, wherein first impurities in the first metal are different than second impurities in the first contacts and the second contacts.

16. The CMOS device of claim 12, wherein the first metal comprises tungsten, and wherein the second metal comprises one or more of titanium, nickel, cobalt, and molybdenum.

17. The CMOS device of claim 12, wherein a thickness of the first metal is between approximately 1 nm and approximately 10 nm.

18. The CMOS device of claim 12, wherein first impurities in the first metal on the first non-planar transistor are the same as second impurities in the first metal on the second non-planar transistor.

19. An electronic device, comprising:
a board;
an intervening substrate attached to the board; and
a die electrically coupled to the intervening substrate, wherein the die comprises a complimentary metal-oxide-semiconductor (CMOS) device, wherein the CMOS device comprises:
  a first transistor with a first metal between a first source region and a first contact, the first metal in contact with the first source region; and
  a second transistor with a second metal and the first metal between a second source region and a second contact, the second metal in contact with the second source region, wherein the first metal is between the second metal and the second contact, the first metal different than the second metal, and the first metal in contact with the second source region.

20. The electronic device of claim 19, wherein the first transistor is a P-type transistor, and wherein the second transistor is an N-type transistor.

* * * * *